United States Patent
Sugiyama et al.

(10) Patent No.: US 9,246,309 B2
(45) Date of Patent: *Jan. 26, 2016

(54) QUANTUM CASCADE LASER

(71) Applicant: HAMAMATSU PHOTONICS K.K., Hamamatsu-shi, Shizuoka (JP)

(72) Inventors: Atsushi Sugiyama, Hamamatsu (JP); Naota Akikusa, Hamamatsu (JP); Tadataka Edamura, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/909,611

(22) Filed: Jun. 4, 2013

(65) Prior Publication Data

US 2013/0322479 A1    Dec. 5, 2013

Related U.S. Application Data

(60) Provisional application No. 61/655,626, filed on Jun. 5, 2012.

(30) Foreign Application Priority Data

Jun. 5, 2012    (JP) ................................. 2012-127676

(51) Int. Cl.
*H01S 5/00*    (2006.01)
*H01S 5/34*    (2006.01)
(Continued)

(52) U.S. Cl.
CPC ............... *H01S 5/3401* (2013.01); *B82Y 20/00* (2013.01); *H01S 5/028* (2013.01); *H01S 5/3402* (2013.01);
(Continued)

(58) Field of Classification Search
CPC ........................ H01S 3/0675; H01S 3/094007
USPC ........................................................ 373/45.01
See application file for complete search history.

(56) References Cited

U.S. PATENT DOCUMENTS 4,372,642 A * 2/1983 Singer et al. ................... 385/130
4,995,684 A * 2/1991 Tustison et al. ............... 359/359
(Continued)

FOREIGN PATENT DOCUMENTS

| JP | H6-204609 | 7/1994 |
|----|-----------|--------|
| JP | 2511890   | 7/1996 |

(Continued)

OTHER PUBLICATIONS

"Distributed feedback laser", http://en.wikipedia.org/wiki/Distributed_feedback_laser May 17, 2013.*
(Continued)

*Primary Examiner* — Xinning Niu
*Assistant Examiner* — Vu A Vu
(74) *Attorney, Agent, or Firm* — Drinker Biddle & Reath LLP

(57) ABSTRACT

A quantum cascade laser includes a semiconductor substrate, and an active layer that is provided on the substrate, and has a cascade structure in which emission layers and injection layers are alternately laminated by multistage-laminating unit laminate structures each consisting of the quantum well emission layer and the injection layer, the active layer generates light by intersubband transition in a quantum well structure. Further, in a laser cavity structure for light with a predetermined wavelength to be generated in the active layer, reflection control films including at least one layer of $CeO_2$ film are formed on a first end face and a second end face facing each other. Thereby, it is possible to realize a quantum cascade laser capable of preferably realizing reflectance control for light within a mid-infrared wavelength region on the laser device end face.

4 Claims, 25 Drawing Sheets

(51) Int. Cl.
*H01S 5/028* (2006.01)
*B82Y 20/00* (2011.01)
*H01S 5/12* (2006.01)
*H01S 5/14* (2006.01)

(52) U.S. Cl.
CPC ............ *H01S 5/0071* (2013.01); *H01S 5/0282* (2013.01); *H01S 5/0287* (2013.01); *H01S 5/12* (2013.01); *H01S 5/141* (2013.01)

(56) References Cited

U.S. PATENT DOCUMENTS

| | | | |
|---|---|---|---|
| 5,140,457 A * | 8/1992 | Letter | 359/359 |
| 5,457,709 A | 10/1995 | Capasso et al. | |
| 5,472,787 A * | 12/1995 | Johnson et al. | 428/448 |
| 5,777,792 A * | 7/1998 | Okada et al. | 359/584 |
| 6,226,308 B1 * | 5/2001 | Samson et al. | 372/40 |
| 6,560,259 B1 * | 5/2003 | Hwang | 372/45.01 |
| 6,990,133 B2 * | 1/2006 | Kikawa et al. | 372/49.01 |
| 7,386,024 B2 * | 6/2008 | Sekiguchi et al. | 372/45.012 |
| 7,684,113 B2 * | 3/2010 | Yamada et al. | 359/359 |
| 7,826,509 B2 * | 11/2010 | Belkin et al. | 372/50.122 |
| 2007/0189352 A1 * | 8/2007 | Nagahama et al. | 372/71 |
| 2008/0037608 A1 * | 2/2008 | Zhou et al. | 372/50.11 |
| 2008/0075133 A1 * | 3/2008 | Day et al. | 372/36 |
| 2008/0159341 A1 * | 7/2008 | Patel et al. | 372/20 |
| 2008/0219308 A1 * | 9/2008 | Yamanishi et al. | 372/44.01 |
| 2008/0233305 A1 * | 9/2008 | Murata | 427/492 |
| 2010/0315645 A1 | 12/2010 | Hall et al. | |
| 2012/0033697 A1 * | 2/2012 | Goyal et al. | 372/45.01 |
| 2012/0276350 A1 * | 11/2012 | Terayama | 428/212 |

FOREIGN PATENT DOCUMENTS

| | | |
|---|---|---|
| JP | H10-321951 | 12/1998 |
| JP | 2000-058970 | 2/2000 |
| JP | 2006-072031 A | 3/2006 |
| JP | 2008-010733 A | 1/2008 |
| JP | 2008-270666 | 11/2008 |
| JP | 2009-054637 | 3/2009 |
| JP | 2009-086533 A | 4/2009 |
| JP | 2009-206340 A | 9/2009 |

OTHER PUBLICATIONS

J. Nguyen et al., "Optical coatings by ion-beam sputtering deposition for long-wave infrared quantum cascade lasers," Applied Physics Letters, 2006, pp. 111113-1-111113-3, vol. 89.

U.S. Office Action dated Feb. 13, 2014 that issued in U.S. Appl. No. 13/909,672 including Double Patenting Rejections on pp. 2-5.

Bai, et al., "Optimizing facet coating of quantum cascade lasers for low power consumption," Journal of Applied Physics, American Institute of Physics, vol. 109, Mar. 3, 2011, p. 053103-1 to 053103-4.

Maulini, et al., "High power thermoelectrically cooled and uncooled quantum cascade lasers with optimized reflectivity facet coatings," Applied Physics Letters, American Institute of Physics, vol. 95, Oct. 15, 2009, p. 151112-1 to 151112-3.

Aellen, et al., "Continuous-wave distributed-feedback quantum-cascade lasers on a Peltier cooler," Applied Physics Letters, American Institute of Physics, vol. 83, No. 10, Sep. 8, 2003, p. 1929-1931.

* cited by examiner

Fig.8

| SEMICONDUCTOR LAYER | | COMPOSITION | LAYER THICKNESS | DOPING |
|---|---|---|---|---|
| INJECTION BARRIER LAYER 171 | | InAlAs | 3.5nm | undoped |
| EMISSION LAYER 17 | WELL LAYER 161 | InGaAs | 3.2nm | undoped |
| | BARRIER LAYER 172 | InAlAs | 2.3nm | undoped |
| | 162 | InGaAs | 7.7nm | undoped |
| | 173 | InAlAs | 0.7nm | undoped |
| | 163 | InGaAs | 6.0nm | undoped |
| | 174 | InAlAs | 1.3nm | undoped |
| | 164 | InGaAs | 5.4nm | undoped |
| EXIT BARRIER LAYER 191 | | InAlAs | 1.6nm | undoped |
| INJECTION LAYER 18 | WELL LAYER 181 | InGaAs | 4.1nm | undoped |
| | BARRIER LAYER 192 | InAlAs | 1.4nm | undoped |
| | 182 | InGaAs | 3.8nm | undoped |
| | 193 | InAlAs | 1.5nm | undoped |
| | 183 | InGaAs | 3.6nm | undoped |
| | 194 | InAlAs | 1.6nm | undoped |
| | 184 | InGaAs | 3.6nm | Si doped: $1\times 10^{17}/cm^3$ |
| | 195 | InAlAs | 2.0nm | Si doped: $1\times 10^{17}/cm^3$ |
| | 185 | InGaAs | 3.6nm | Si doped: $1\times 10^{17}/cm^3$ |
| | 196 | InAlAs | 2.3nm | Si doped: $1\times 10^{17}/cm^3$ |
| | 186 | InGaAs | 3.6nm | undoped |
| | 197 | InAlAs | 2.6nm | undoped |
| | 187 | InGaAs | 3.5nm | undoped |

QUANTUM CASCADE LASER

CROSS-REFERENCE TO RELATED APPLICATION

This application claims priority to Provisional Application Ser. No. 61/655,626 filed on Jun. 5, 2012, which is hereby incorporated by reference in its entirety.

BACKGROUND OF THE INVENTION

1. Field of the Invention

The present invention relates to a quantum cascade laser using intersubband transition in a quantum well structure.

2. Related Background Art

Light with a mid-infrared wavelength region (for example, wavelength of 4 to 15 μm) is an important wavelength region in the field of spectroscopy analysis. As a high-performance semiconductor light source in this wavelength region, in recent years, quantum cascade lasers (QCL) have gained attention (for example, refer to Patent Documents 1 to 3 and Non-Patent Document 1).

A quantum cascade laser is a monopolar type laser device which uses a level structure including subbands formed in a semiconductor quantum well structure and generates light by means of intersubband electron transition, and can realize high efficiency and high-output operations by multistage cascade-coupling of quantum well emission layers which are formed by quantum well structures and become active regions. Further, this cascade coupling of quantum well emission layers is realized by using electron injection layers for injecting electrons into emission upper levels and alternately laminating quantum well emission layers and injection layers.

Patent Document 1: U.S. Pat. No. 5,457,709
Patent Document 2: Japanese Patent Application Laid-Open No. 2009-206340
Patent Document 3: Japanese Patent Application Laid-Open No. 2008-10733
Patent Document 4: Japanese Patent Application Laid-Open No. 2006-72031
Patent Document 5: Japanese Patent Application Laid-Open No. 2009-86533
Non-Patent Document 1: J. Nguyen et al., "Optical coatings by ion-beam sputtering deposition for long-wave infrared quantum cascade lasers," Appl. Phys. Lett. Vol. 89 (2006) 111113-1-111113-3

SUMMARY OF THE INVENTION

In the above-described mid-infrared quantum cascade laser, reflectance control on end faces in the laser cavity structure is very important. For example, for a single-mode laser device such as a quantum cascade laser of an external cavity (EC) type or a distributed feedback (DFB) type in which a diffraction grating is disposed in the device, it is indispensable to form a reflection control film such as an anti-reflection (AR) film or a high-reflection (HR) film on device end faces located in an optical resonating direction.

However, in such formation of a reflection control film at a device end face of a quantum cascade laser, a material showing high permeability (transparency) to light within a mid-infrared region, particularly to light within a wavelength region of 7 to 15 μm, and showing good insulation properties when being formed on the device end face has not been sufficiently known.

The present invention has been made to solve the above-described problem, and an object thereof is to provide a quantum cascade laser capable of preferably realizing reflectance control with respect to light within a mid-infrared region on laser device end faces.

In order to achieve the above object, a quantum cascade laser according to the present invention includes (1) a semiconductor substrate, and (2) an active layer that is provided on the semiconductor substrate, and has a cascade structure in which quantum well emission layers and injection layers are alternately laminated by multistage-laminating unit laminate structures each consisting of the quantum well emission layer and the injection layer, the active layer generates light by intersubband transition in a quantum well structure, and (3) in a laser cavity structure for light with a predetermined wavelength to be generated in the active layer, a reflection control film including at least one layer of $CeO_2$ film is formed on at least one of a first end face and a second end face facing each other.

In the quantum cascade laser described above, a reflection control film including a $CeO_2$ film is formed on at least one of the first and second end faces located in the resonating direction in the laser cavity structure for light with a predetermined wavelength to be generated in the active layer. Here, in accordance with the results of the study by the inventors of the present application, as will be described later in detail, $CeO_2$ (cerium oxide) is a material showing high permeability to light within a mid-infrared region, and showing good insulation properties when being formed on a laser device end face. Accordingly, a reflection control film including a $CeO_2$ film is applied to a quantum cascade laser, thereby it is possible to preferably realize reflectance control for light within a mid-infrared region on the device end face.

According to the quantum cascade laser of the present invention, in the laser cavity structure for light with a predetermined wavelength generated by intersubband transition in the active layer having the cascade structure, a reflection control film including at least one layer of $CeO_2$ film is formed on at least one of the first end face and the second end face facing each other, thereby it is possible to preferably realize reflectance control for light within a mid-infrared region on the laser device end faces.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIG. 8 is a chart showing an example of a structure of a unit laminate structure of one period in the active layer.

DESCRIPTION OF THE EMBODIMENTS

Figure 1:
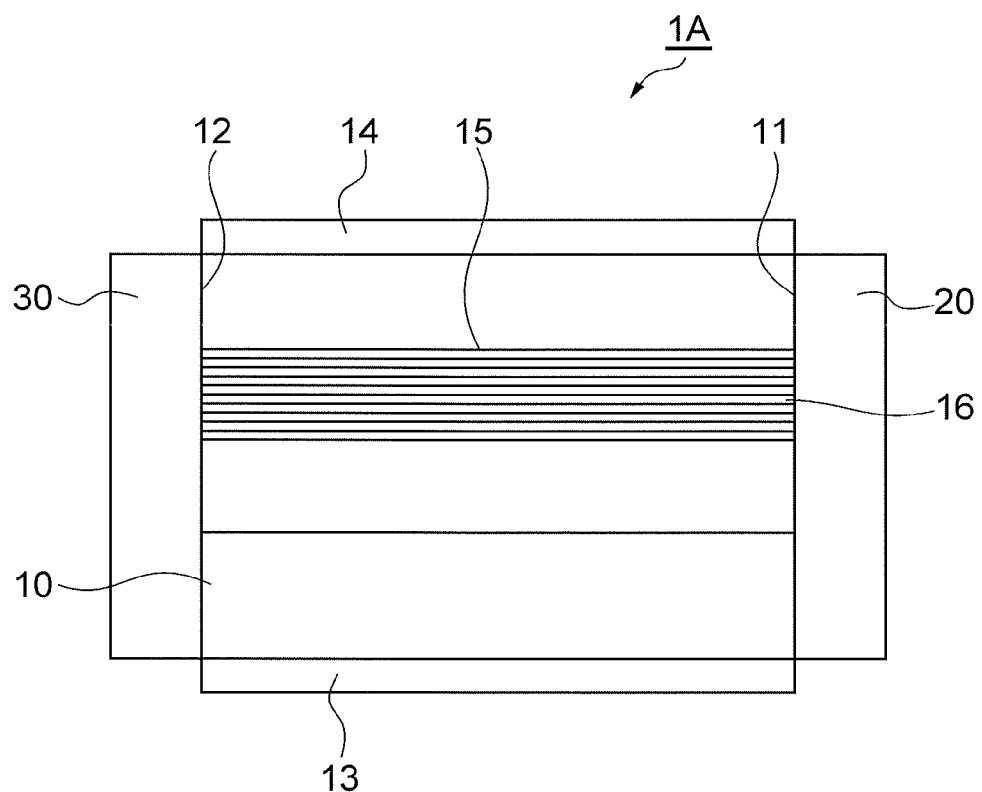
FIG. 1 is a view schematically showing a basic configuration of a quantum cascade laser.

Hereinafter, an embodiment of a quantum cascade laser according to the present invention will be described in detail with reference to the drawings. In the description of the drawings, the same components are attached with the same reference symbols, and overlapping description will be omitted. Moreover, the dimensional ratios in the drawings are not always equal to those in the description.

FIG. 1 is a view schematically showing a basic configuration of a quantum cascade laser according to the present invention. A quantum cascade laser 1A of the present embodiment is a monopolar type laser device which generates light by using intersubband electron transition in a semiconductor quantum well structure. This quantum cascade laser 1A includes a semiconductor substrate 10 and an active layer 15 formed on the substrate 10. Further, in the quantum cascade laser 1A, electrodes 13 and 14 for driving the laser 1A are respectively formed on the substrate 10 side (the lower side in the drawing) and on the active layer 15 side (the upper side in the drawing).

The active layer 15 has a cascade structure formed by alternately multistage-laminating quantum well emission layers to be used for generating light and electron injection layers to be used for injecting electrons into the emission layers. Specifically, a semiconductor lamination structure consisting of a quantum well emission layer and an injection layer is a unit laminate structure 16 of one period, and by multistage-laminating the unit laminate structures 16, the active layer 15 having a cascade structure is formed. The number of laminations of the unit laminate structures 16 each including the quantum well emission layer and the injection layer is, for example, about several hundred, although it is arbitrarily set. The active layer 15 is formed on the semiconductor substrate 10 directly or via another semiconductor layer.

Figure 2:
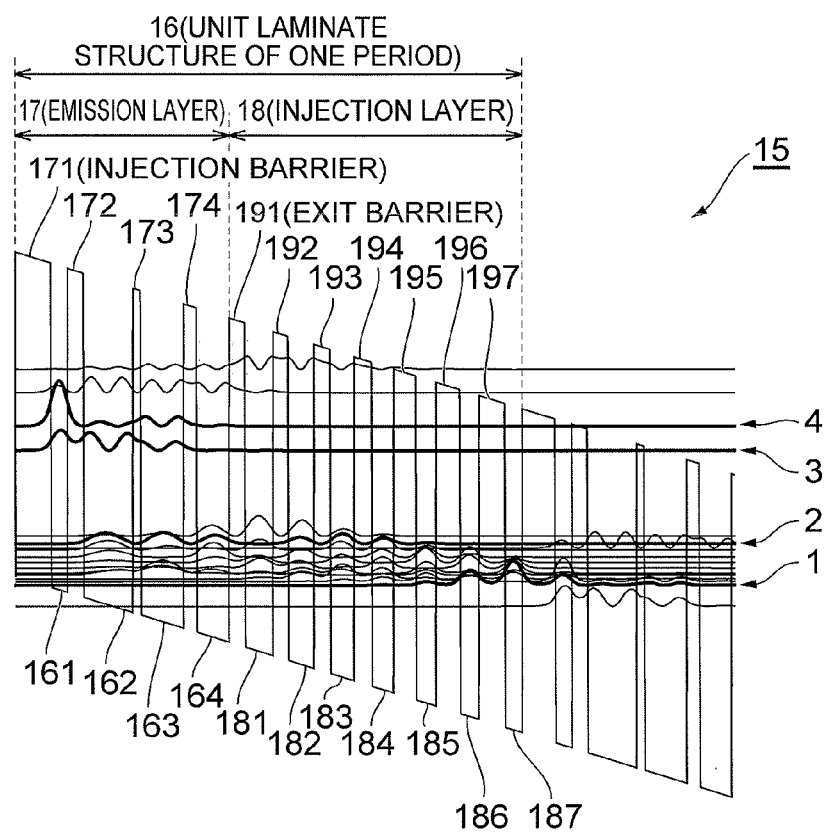
FIG. 2 is a diagram showing examples of a configuration of an active layer of the quantum cascade laser and a subband level structure in the active layer.

FIG. 2 is a diagram showing examples of a configuration of the active layer of the quantum cascade laser 1A shown in FIG. 1, and a subband level structure to be formed in the active layer. In addition, FIG. 2 schematically shows the quantum well structure and the subband level structure in a part of the multistage repetitive structure of the unit laminate structures 16 in the active layer 15 of the quantum cascade laser 1A. Further, in this figure, a position in the lamination direction inside the active layer is shown in the horizontal direction, and energy is shown in the vertical direction.

As shown in FIG. 2, each of the plurality of unit laminate structures 16 included in the active layer 15 consists of a quantum well emission layer 17 and an electron injection layer 18. Each of these emission layer 17 and injection layer 18 is formed to have a predetermined quantum well structure including quantum well layers and quantum barrier layers. Accordingly, in the unit laminate structure 16, a subband level structure that is an energy level structure according to a quantum well structure is formed.

In this configuration example, the unit laminate structure 16 of one period in the active layer 15 is formed as a quantum well structure formed by alternately laminating eleven quantum well layers 161 to 164 and 181 to 187, and eleven quantum barrier layers 171 to 174 and 191 to 197. Further, in this lamination structure, the lamination portion consisting of the four well layers 161 to 164 and barrier layers 171 to 174 is the emission layer 17, and the lamination portion consisting of the seven well layers 181 to 187 and barrier layers 191 to 197 is the injection layer 18.

Among semiconductor layers of the emission layer 17, the quantum barrier layer 171 of the first stage is an injection barrier layer that is positioned between the injection layer of the preceding stage and the emission layer 17 and serves as an injection barrier against electrons from the injection layer of the preceding stage to the emission layer. Among semiconductor layers of the injection layer 18, the quantum barrier layer 191 of the first stage is an exit barrier layer that is positioned between the emission layer 17 and the injection layer 18 and serves as an exit barrier against electrons from the emission layer to the injection layer.

The unit laminate structure 16 shown in FIG. 2, in the subband level structure, has an emission upper level (level 3) and an emission lower level (level 2) as levels relating to light emission by means of intersubband transition. In addition to these emission upper level and lower level, the unit laminate structure 16 further has an injection level (level 4) as an energy level higher than the upper level 3, and a relaxation level (level 1) as an energy level lower than the lower level 2.

In this subband level structure, electrons e⁻ from the injection layer of the preceding stage are injected into the injection level 4 of the emission layer 17 due to a resonant tunneling effect via the injection barrier layer 171. Further, the electrons injected into the injection level 4 are supplied to the upper level 3 by means of, for example, longitudinal optical (LO) phonon scattering, etc. Moreover, the electrons supplied to the upper level 3 emission-transit to the lower level 2, and at this time, light hv with a wavelength corresponding to the energy difference between the subband levels of the level 3 and the level 2 is generated. Further, the electrons that have transited to the lower level 2 are relaxed and extracted to the relaxation level 1 by means of the LO phonon scattering, etc. Accordingly, a population inversion for realizing laser oscillation between the upper level 3 and the lower level 2 is formed.

The electrons relaxed to the relaxation level 1 are injected into the injection level of the emission layer of the subsequent stage via the exit barrier layer 191 and the injection layer 18. These injection, emission transition and relaxation of electrons are repeated in the plurality of unit laminate structures 16 constituting the active layer 15, whereby light generation occurs in a cascade manner in the active layer 15. That is, by alternately laminating many emission layers 17 and injection layers 18, the electrons successively move through the laminate structures 16 in a cascade manner, and light hv with a predetermined wavelength is generated at the time of the intersubband transition in each laminate structure. Moreover, such light is resonated in the laser cavity structure of the laser 1A, whereby a laser beam with a predetermined wavelength is generated.

FIG. 2 shows an example of the semiconductor lamination structure, the quantum well structure, and the subband level structure in the unit laminate structure 16 of the active layer 15, specifically, without limiting to the above-described configuration, various other configurations may be adopted. Generally, any configuration of the active layer 15 may be adopted as long as the active layer has a cascade structure and is configured to be capable of generating light by intersubband transition in the quantum well structure. For example, in the subband level structure shown in FIG. 2, the injection level 4 and the relaxation level 1 may not be provided if they are unnecessary. Further, the numbers of quantum well layers and barrier layers constituting the emission layer 17 and the injection layer 18, and the respective layer thicknesses of these as well may be arbitrarily set according to a specific level structure, etc., necessary for the light emitting operations.

In the quantum cascade laser 1A according to the present embodiment, as schematically shown in FIG. 1, in the laser cavity structure for light hv with a predetermined wavelength to be generated in the active layer 15, the both end faces of the first end face 11 and the second end face 12 are provided so as to face each other in the resonating direction (in the right and left direction in the drawing). Then, with respect to these respective laser device end faces, a first reflection control film 20 is formed on the first end face 11, and a second reflection control film 30 is formed on the second end face 12. Each of the first and second reflection control films 20 and 30 is, for example, an anti-reflection (AR) film or a reflection film such as a high-reflection (HR) film. Further, each of these first and second reflection control films 20 and 30 is configured to include at least one layer of $CeO_2$ film. In addition, the configurations of the reflection control films 20 and 30 will be further specifically described later.

The effects of the quantum cascade laser 1A of the present embodiment will be described.

In the quantum cascade laser 1A shown in FIG. 1 and FIG. 2, the first and second reflection control films 20 and 30 respectively including $CeO_2$ films are formed on the first and second end faces 11 and 12 located in the resonating direction in the laser cavity structure for light hv with a predetermined wavelength to be generated in the active layer 15. Here, in accordance with the results of the study by the inventors of the present application, $CeO_2$ (cerium oxide) is an optical material showing high permeability (transparency) to light within a mid-infrared region, for example, light within a wavelength region of 7 to 15 μm, and showing good insulating performance when being formed on the end faces 11 and 12. Accordingly, such reflection control films 20 and 30 including $CeO_2$ films are applied onto the laser device end faces of the quantum cascade laser 1A, thereby it is possible to preferably realize reflectance control for light within a mid-infrared region on the device end faces 11 and 12.

To describe in detail, in reflectance control at the device end face of the quantum cascade laser 1A, in a mid-infrared region with a wavelength of, for example, 4 μm or more, an optical material which is widely used in a visible region and a near-infrared region generally has high absorption of light, that does not provide preferable characteristics. Further, in a fluoride-based material such as $CaF_2$ or $BaF_2$, it is difficult to respond to a wavelength region of 10 μm or more.

As a reflection control film used for such a wavelength region, for example, a multilayer film using ZnS or ZnSe as a low refraction index material, and using Ge as a high refraction index material may be considered. However, in the configuration using these optical materials, it is difficult to secure insulation with the laser device, and it is difficult to respond to a wavelength region of 10 μm or more. On the other hand, in the case where an insulating film of a material such as $Al_2O_3$ or $SiO_2$ is formed on a device end face, the laser beam output is lowered due to absorption of light in the insulating film. Further, in the case where a thin insulating film is formed in order to secure permeability of light, it is not possible to secure sufficient insulation, and stable operations of the device cannot be obtained. Further, the anti-reflection film consisting of a multilayer film of ZnO/PbTe is used for example in Non-Patent Document 1, however, sufficient characteristics have not been obtained even in such a configuration.

Further, in the case where ZnS, ZnSe, PbTe, or the like is used as a material of the reflection control film, with respect to these materials, composition control of group VI elements is difficult at the time of forming a multilayer film by a method such as vapor deposition, which may lower the yield as devices in some cases. Further, in view of the harmful effect as substances, regulations by law, and the like, there are problems with these materials for composing the laser device, which is not at the laboratory level, but to be widely distributed.

With respect to such problems, in view of securement of insulation with the laser device, generally, an oxidative product may be used as an optical material composing a reflection control film. With respect to this, the inventors of the present application have examined optical constants in a mid-infrared region of various materials by use of a spectroscopic ellipsometer, and obtained knowledge that the above-described $CeO_2$ shows promise. This $CeO_2$ is a substance which does not fall under the category of poisonous materials, and allows normal handling.

Here, a spectroscopic ellipsometry for examining the characteristics of an optical material will be briefly described. It is very important in designing a functional optical thin film such as a reflection control film to accurately understand optical characteristics such as a refraction index or an extinction coefficient of an optical material within a desired wavelength range. The inventors of the present application have introduced a spectroscopic ellipsometer which is capable of measuring a wavelength within a range of 2 to 30 μm, and carried out direct evaluation of optical characteristics of various materials in a mid-infrared region.

In ellipsometry, it is possible to measure two independent amounts, that is, an amplitude ratio Ψ and a phase difference Δ, and it is possible to directly obtain a real part and an imaginary part of a complex dielectric constant (complex refraction index). An amplitude ratio Ψ and a phase difference Δ are expressed as follows, and are described as changes in the polarization state of reflected light on or transmitted light through a sample.

$$\tan\Psi \cdot e^{i\Delta} = \rho = \frac{r_p}{r_s}$$

Here, $r_p$ and $r_s$ are reflectivity coefficients of a measurement sample with respect to polarizations (p-polarization, s-polarization) on an incident surface. The spectroscopic ellipsometry measures this complex ratio ρ as a function of wavelength.

In multiple incident angle spectroscopic ellipsometry, the above-described measurement is executed with the both of a wavelength and an incident angle serving as functions, thereby it is possible to evaluate an unknown multilayer film. Further, it is possible to directly convert an amplitude ratio Ψ and a phase difference Δ into optical constants of the material by the following expression.

$$\langle\varepsilon\rangle = \langle\varepsilon_1\rangle + i\langle\varepsilon_2\rangle = \langle\tilde{n}\rangle^2 = (\langle n\rangle + i\langle k\rangle)^2 = \sin(\phi)^2\left[1 + \tan(\phi)^2\left(\frac{1-\rho}{1+\rho}\right)^2\right]$$

Here, φ is an incident angle of light. Measurements at several points (for example, three points) are made while changing incident angles, and fitting is performed so as to satisfy the relational expression at the same time as an optical path length is changed according to a change in incident angle, thereby it is possible to determine a refraction index n and an extinction coefficient k of the measurement sample with a high accuracy independent of its film thickness.

Figure 3:
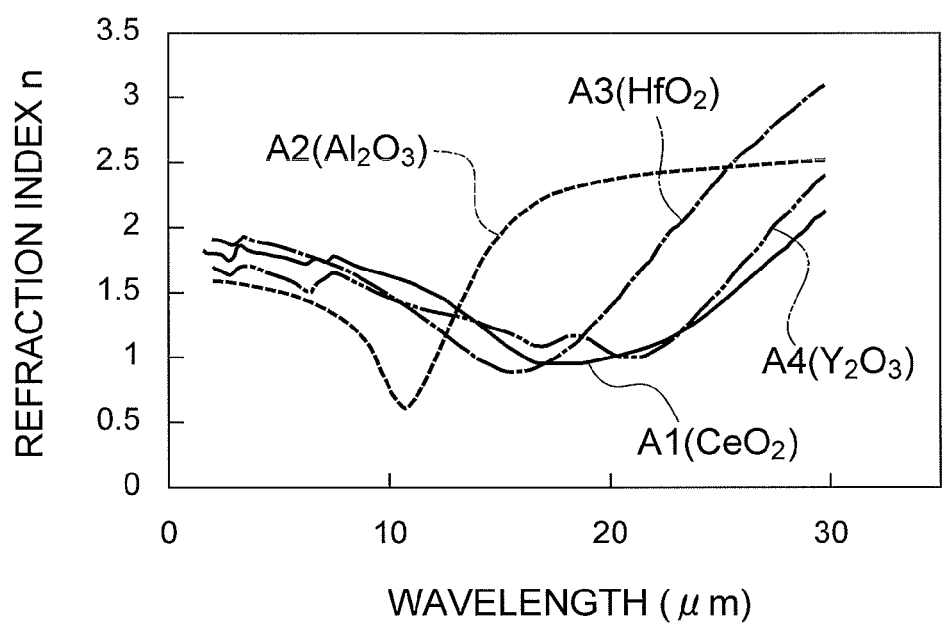
FIG. 3 is a graph showing wavelength dependency of a refraction index n of oxide-based optical materials.

FIG. 3 is a graph showing wavelength dependency of refraction indices n of oxide-based optical materials. In this graph, the horizontal axis indicates the wavelength (μm), and the vertical axis indicates the refraction index n. Further in the graph of FIG. 3, the graphs A1, A2, A3, and A4 respectively indicate the characteristics of refraction indices of $CeO_2$, $Al_2O_3$, $HfO_2$, and $Y_2O_3$ which are oxide-based optical materials.

Figure 4:
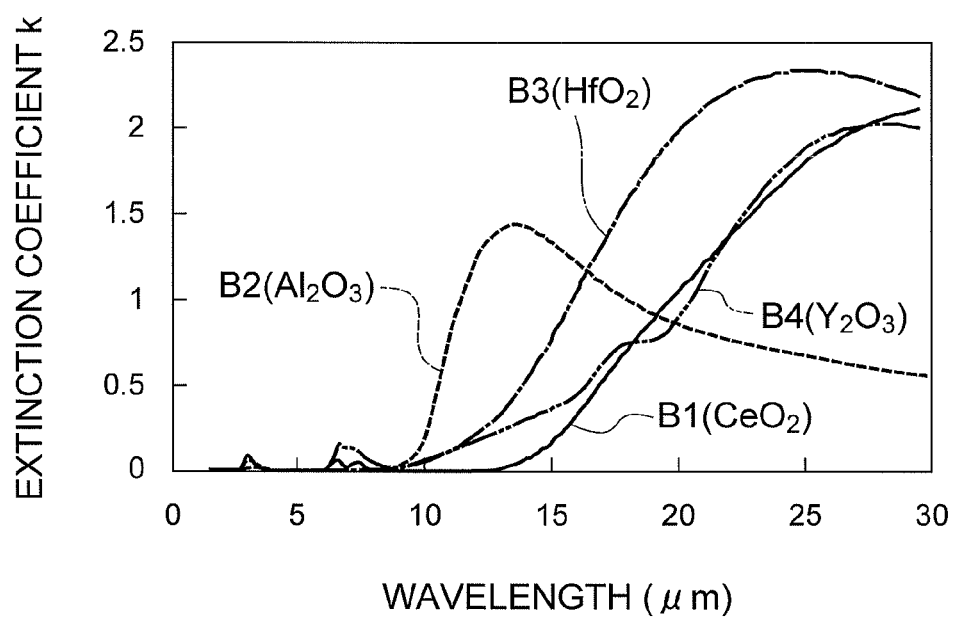
FIG. 4 is a graph showing wavelength dependency of extinction coefficients k of the oxide-based optical materials.
Figure 5:
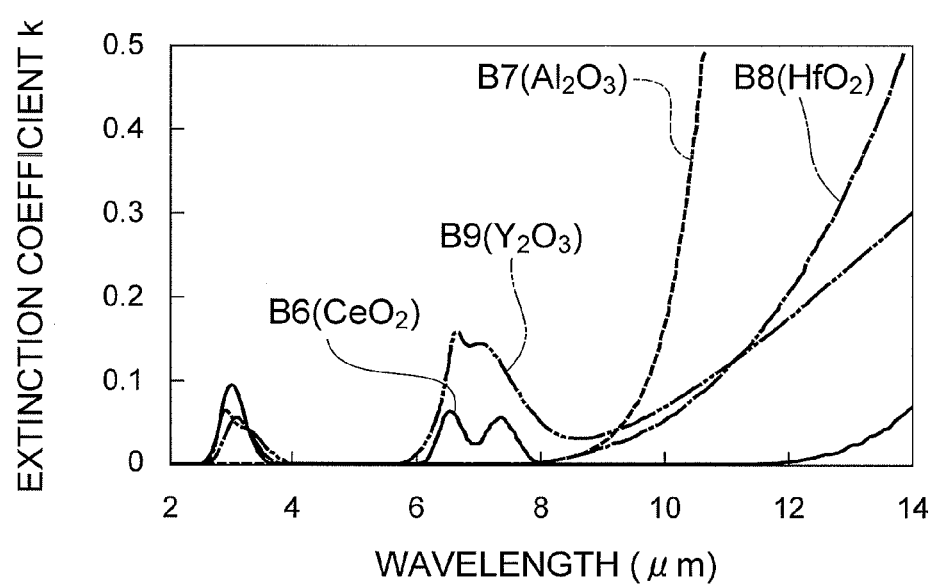
FIG. 5 is a graph showing wavelength dependency of extinction coefficients k of the oxide-based optical materials.

FIG. 4 and FIG. 5 are graphs showing wavelength dependency of extinction coefficients k of the oxide-based optical materials. In these graphs, the horizontal axes indicate the wavelength (μm), and the vertical axes indicate the extinction coefficient k. Further in the graph of FIG. 4, the graphs B1, B2, B3, and B4 respectively indicate the characteristics of extinction coefficients of $CeO_2$, $Al_2O_3$, $HfO_2$, and $Y_2O_3$ which are oxide-based optical materials. Further in the graph of FIG. 5, the graphs B6, B7, B8, and B9 respectively indicate the characteristics of extinction coefficients of $CeO_2$, $Al_2O_3$, $HfO_2$, and $Y_2O_3$ so as to partially enlarge those in the same way.

For example, assuming a multilayer film whose high refraction index material of Ge as a reflection control film, because Ge has a refraction index n=4, it is necessary for a low refraction index material to have a refraction index of at least n≤4, and preferably n<2.5, and it is required to be sufficiently transparent even in a region of a wavelength of 10 μm or more. Meanwhile, as shown in the graph of FIG. 3, $CeO_2$ has a refraction index n<2, that can be preferably used as a low refraction index material in the reflection control multilayer film.

Further, as shown in the graphs of FIG. 4 and FIG. 5, as compared with other oxide-based materials, $CeO_2$ has higher permeability approximately up to a wavelength of 15 μm. Accordingly, it is possible to preferably apply $CeO_2$ for a reflection control film for light in a mid-infrared region. In addition, in the above-described Non-Patent Document 1, with respect to the high-reflection film including an Au film, a $Y_2O_3$ film is formed as an insulating film in place of an $Al_2O_3$ film or the like on the device end face side thereof. Meanwhile, according to the graphs of FIG. 4 and FIG. 5, $Y_2O_3$ is increased in absorption when a wavelength is 10 μm or more, and it is considered that $Y_2O_3$ cannot be preferably used for a reflection control film for light in a mid-infrared region.

Further, in the case where a $CeO_2$ film is used for a reflection control film, $CeO_2$ has a property of reacting to atmospheric moisture, therefore, as shown in the graphs of FIG. 4 and FIG. 5, absorption due to an OH-group may occur in a region of a wavelength of 10 μm or less in some cases. In such a case, for example, substrate heating is preferably performed at the time of formation of a $CeO_2$ film by electron beam evaporation or the like.

Figure 6:
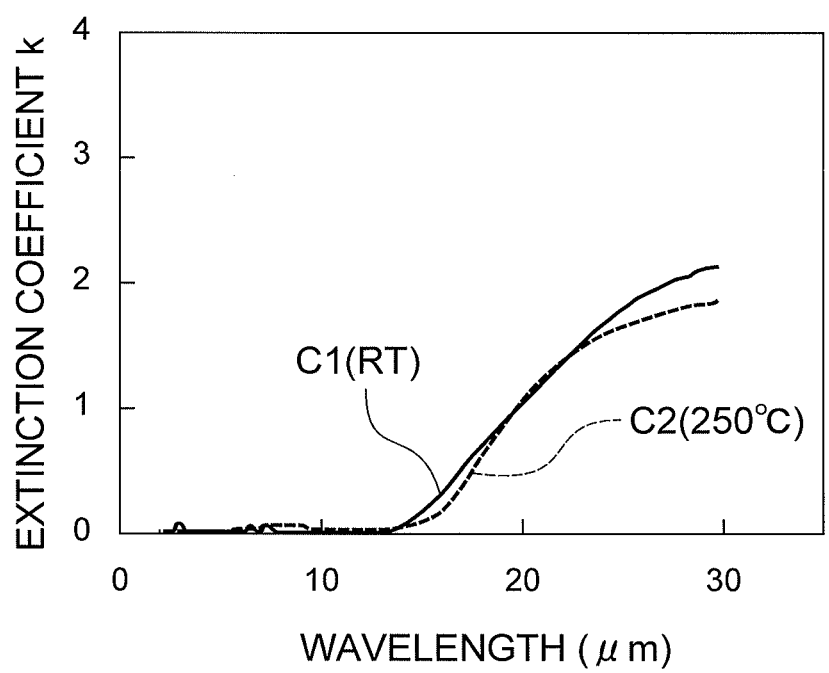
FIG. 6 is a graph showing wavelength dependency of extinction coefficients k of $CeO_2$.

FIG. 6 is a graph showing wavelength dependency of extinction coefficients k of $CeO_2$, and the graph C1 shows the characteristics of extinction coefficient of $CeO_2$ in the case where film formation is performed at a room temperature, and the graph C2 shows the characteristics of extinction coefficient of $CeO_2$ in the case where film formation is performed by carrying out substrate heating at 250° C. As shown in this graph, it is understood that, by carrying out substrate heating at the time of film formation, the effect by absorption due to the OH-group is reduced by prevention of mixing with moisture, an improvement in film quality, and the like, and the transparent region extends to the long wavelength side.

Figure 7:
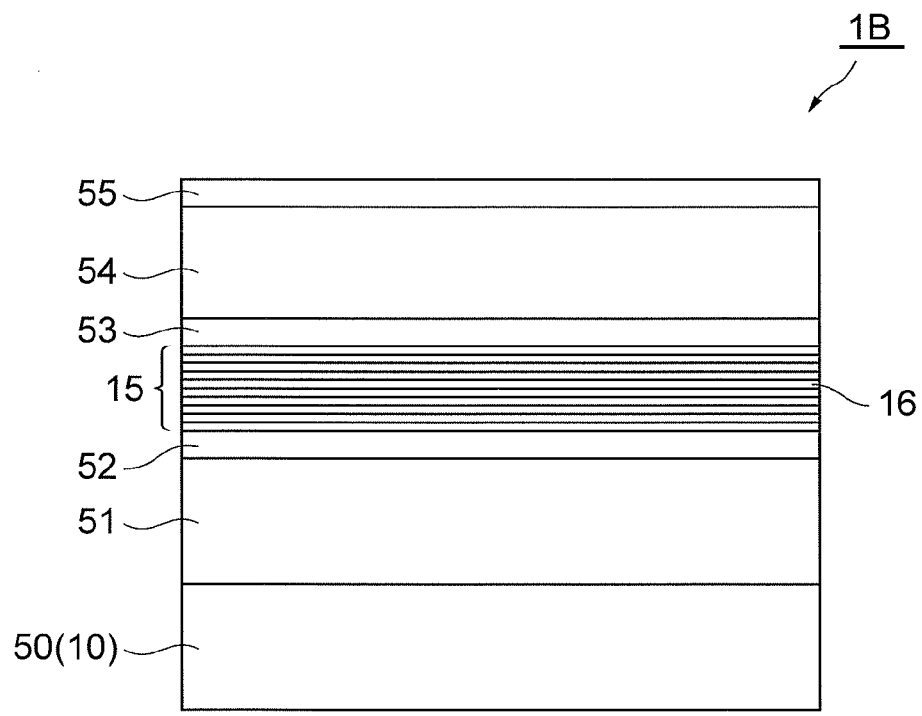
FIG. 7 is a view showing an example of a specific configuration of the quantum cascade laser.

A specific example of the configuration of the quantum cascade laser according to the present invention will be described. FIG. 7 is a view showing an example of a specific configuration of the quantum cascade laser. In addition, in the drawings shown below, the electrodes 13 and 14 (refer to FIG. 1) respectively formed on the substrate side and the active layer side of the quantum cascade laser are not shown.

Here, as a method for forming the device structure of the quantum cascade laser, various methods may be adopted as long as a single crystal thin film with sufficiently high quality can grow. As such a forming method, for example, crystal growth by the molecular beam epitaxy (MBE) method or the metal-organic vapor phase epitaxy (MOVPE) method is available.

In the semiconductor lamination structure of a quantum cascade laser 1B shown in FIG. 7, an n-type InP single crystal substrate 50 is used as a semiconductor substrate 10. Then, on this InP substrate 50, in order from the substrate side, an InP lower cladding layer 51 with a thickness of 3.5 μm, an InGaAs lower guide layer 52 with a thickness of 0.25 the active layer 15 formed by multistage-laminating the unit laminate structures 16, an InGaAs upper guide layer 53 with a thickness of 0.25 μm, an InP upper cladding layer 54 with a thickness of 3.5 μm, and an InGaAs contact layer 55 with a thickness of 20 nm are laminated sequentially, and accordingly, the device structure of the quantum cascade laser 1B is formed. In this configuration example, the same laser cavity structure as in FIG. 1 (not shown in FIG. 7) is also used.

The active layer 15 in this configuration example is configured by laminating 40 periods of the unit laminate structures 16 each including the quantum well emission layer 17 and the electron injection layer 18. Further, the unit laminate structure 16 of one period is configured as a quantum well structure by alternately laminating eleven quantum well layers 161 to 164 and 181 to 187, and eleven quantum barrier layers 171 to 174 and 191 to 197 in the same way as the configuration example schematically shown in FIG. 2.

Among these semiconductor layers constituting the unit laminate structure 16, the quantum well layers are formed of InGaAs layers, respectively. Further, the quantum barrier layers are formed of InAlAs layers, respectively. Accordingly, the active layer 15 consists of an InGaAs/InAlAs quantum well structure. FIG. 8 shows an example of a specific structure of the unit laminate structure 16 of one period in the active layer 15. The wavelength of the laser oscillation light in this configuration example is $\lambda$=8.5 μm.

A specific configuration of a reflection control film to be formed on a device end face of the quantum cascade laser will be further described. With respect to the reflection control film including the $CeO_2$ film described above, the configuration in which the first and second reflection control films 20 and 30 are provided on the both end faces of the first and second end faces 11 and 12 in the resonating direction in the quantum cascade laser 1A of FIG. 1 is exemplified. According to this configuration, it is possible to preferably constitute a cavity structure in the laser device. However, generally, such a reflection control film may be formed on at least one of the first and second end faces facing each other according to a specific configuration, etc., of the laser cavity structure.

Further, such a reflection control film on a laser device end face may have, specifically, a configuration as a multilayer film in which $CeO_2$ films serving as low refraction index films and high refraction index films formed of a predetermined material other than $CeO_2$ are laminated. According to such a reflection control multilayer film, it is possible to preferably set and control a reflectance for light with a predetermined wavelength on the device end face by the specific design of the number of layers and the layer thickness or the like in the multilayer structure using the low refraction index films and the high refraction index films.

Further, in the case where a reflection control film is configured as a multilayer film in this way, high refraction index films in the multilayer film are preferably Ge films as described above in regard to the graph of the refraction indices of FIG. 3, with respect to the $CeO_2$ films functioning as low refraction index films. Thus, according to the structure in which one or a plurality of $CeO_2$ films and one or a plurality of Ge films are alternately laminated, it is possible to preferably constitute a reflection control film having the multilayer structure.

Alternatively, such a reflection control film may be composed of, not a multilayer film including $CeO_2$ films as described above, but a single $CeO_2$ film. According to such a configuration as well, it is possible to preferably set and control a reflectance for light with a predetermined wavelength on a device end face by a specific design of a film thickness of the $CeO_2$ film or the like.

Further, in the quantum cascade laser having the above-described configuration, the reflection control film formed on the laser device end face is preferably an anti-reflection film for light with a predetermined wavelength, or a reflection film that reflects light with a predetermined wavelength at a predetermined reflectance. By using such an anti-reflection (AR) film or a reflection film (for example, a high-reflection (HR) film) including a $CeO_2$ film, it is possible to preferably constitute a quantum cascade laser according to the specific cavity structure thereof. Hereinafter, a specific example of a configuration and the characteristics of the reflection control film will be described with reference to FIG. 9 to FIG. 20.

Figure 9:
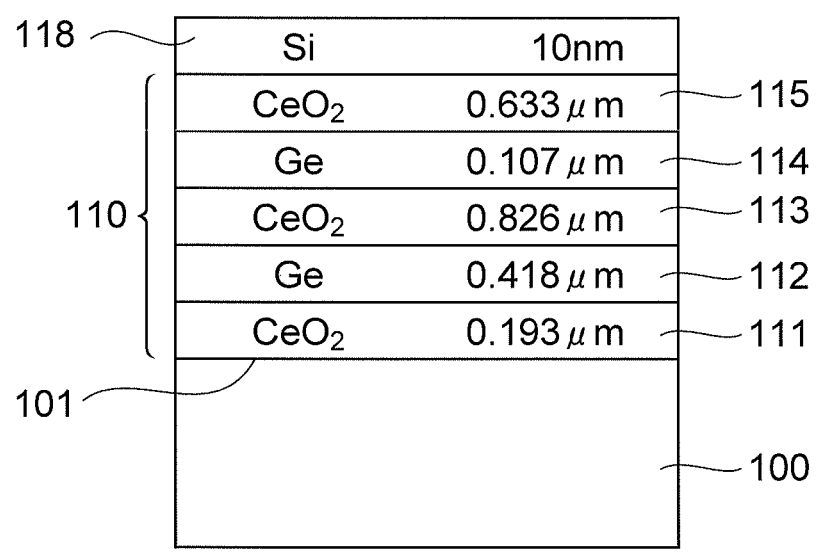
FIG. 9 is a side view showing a first configuration example of a reflection control film.

FIG. 9 is a side view showing a first configuration example of a reflection control film. A reflection control film 110 of the present configuration example is designed as an anti-reflection (AR) film for light with a wavelength $\lambda$=10 μm, and a $CeO_2$ film 111 with a thickness of 0.193 μm, a Ge film 112 with a thickness of 0.418 μm, a $CeO_2$ film 113 with a thickness of 0.826 μm, a Ge film 114 with a thickness of 0.107 μm, and a $CeO_2$ film 115 with a thickness of 0.633 μm are laminated on an end face 101 of a support 100, thereby composing the anti-reflection film 110 as a multilayer film consisting of the $CeO_2$ low refraction index films and the Ge high refraction index films.

In addition, in the configuration shown in FIG. 9, the support 100 corresponds to the device main body portion of the quantum cascade laser 1A including the substrate 10 and the active layer 15, for example, in the configuration shown in FIG. 1. Further, the end face 101 on which the anti-reflection film 110 is formed corresponds to the first end face 11 or the second end face 12 in the cavity structure of the laser 1A. Further, an Si film 118 with a thickness of 10 nm shown in FIG. 9 is, as will be described later, a protection film formed as the outermost layer with a film thickness which does not have an effect on the optical characteristics of the anti-reflection film 110.

Figure 10:
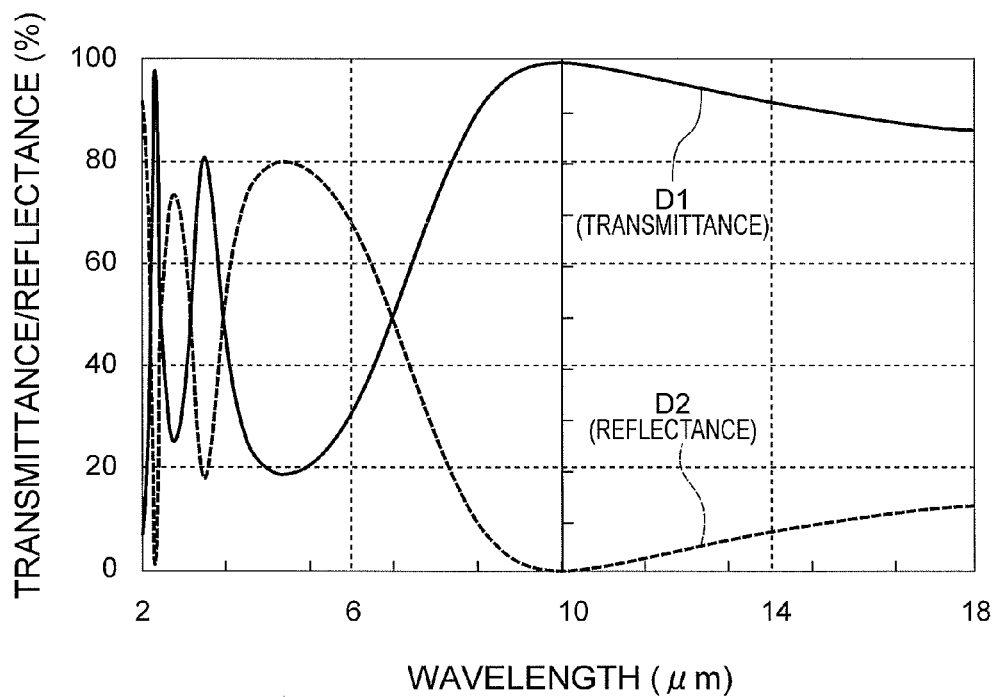
FIG. 10 is a graph showing the optical characteristics of the reflection control film shown in FIG. 9.

FIG. 10 is a graph showing the optical characteristics of the reflection control film 110 shown in FIG. 9. In this graph, the horizontal axis indicates the wavelength (μm), and the vertical axis indicates the transmittance or the reflectance of light (%). Further in the graph of FIG. 10, the graph D1 indicates the transmittance, and the graph D2 indicates the reflectance. In this configuration example of the multilayer film, a high transmittance T=99.995% is obtained for light with a wavelength of 10 μm.

Figure 11:
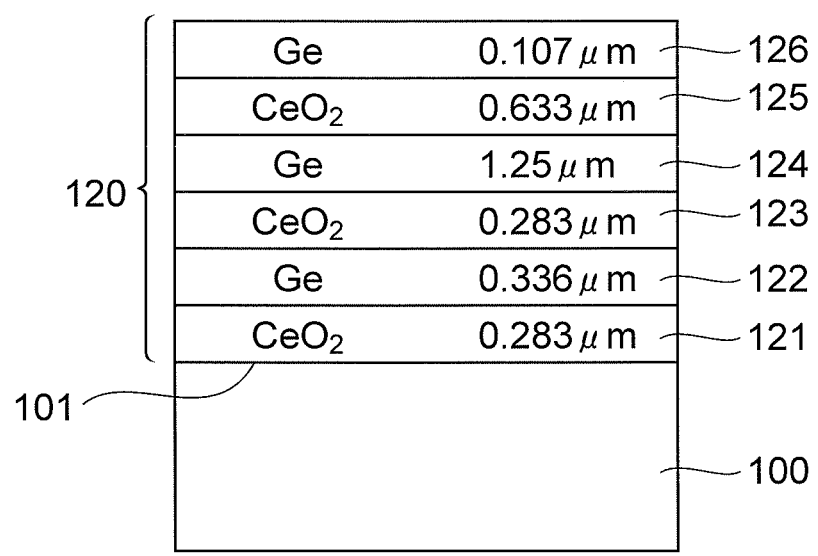
FIG. 11 is a side view showing a second configuration example of a reflection control film.

FIG. 11 is a side view showing a second configuration example of a reflection control film. A reflection control film 120 of the present configuration example is designed as an anti-reflection (AR) film for light in a wide band including a wavelength $\lambda$=10 μm, and a $CeO_2$ film 121 with a thickness of 0.283 μm, a Ge film 122 with a thickness of 0.336 μm, a $CeO_2$ film 123 with a thickness of 0.283 μm, a Ge film 124 with a thickness of 1.25 μm, a $CeO_2$ film 125 with a thickness of 0.633 μm, and a Ge film 126 with a thickness of 0.107 μm are laminated on the end face 101 of the support 100, thereby composing the anti-reflection film 120 as a multilayer film.

Figure 12:
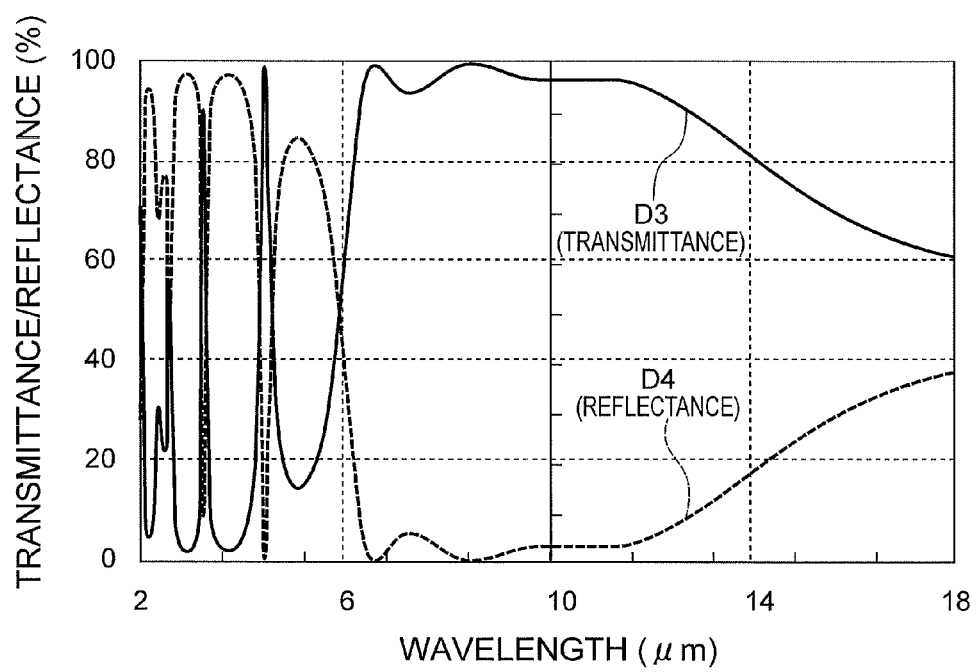
FIG. 12 is a graph showing the optical characteristics of the reflection control film shown in FIG. 11.

FIG. 12 is a graph showing the optical characteristics of the reflection control film 120 shown in FIG. 11. In the graph of FIG. 12, the graph D3 indicates the transmittance, and the graph D4 indicates the reflectance. In this configuration example of the multilayer film, a high transmittance T=96.855% is obtained for light with a wavelength of 10 μm, and further, a high transmittance T is obtained in a wide band of wavelength including a wavelength 10

Figure 13:
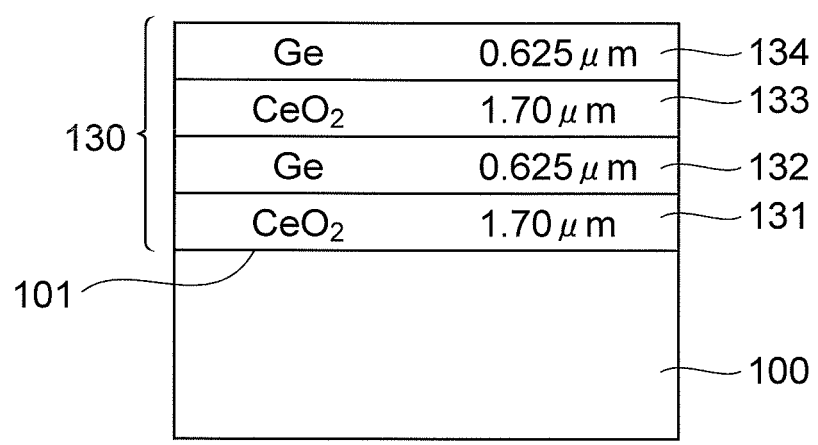
FIG. 13 is a side view showing a third configuration example of a reflection control film.

FIG. 13 is a side view showing a third configuration example of a reflection control film. A reflection control film 130 of the present configuration example is designed as a high-reflection (HR) film for light with a wavelength $\lambda$=10 μm, and a $CeO_2$ film 131 with a thickness of 1.70 μm, a Ge film 132 with a thickness of 0.625 μm, a $CeO_2$ film 133 with a thickness of 1.70 μm, and a Ge film 134 with a thickness of 0.625 μm are laminated on the end face 101 of the support 100, thereby composing the high-reflection film 130 as a multilayer film.

Figure 14:
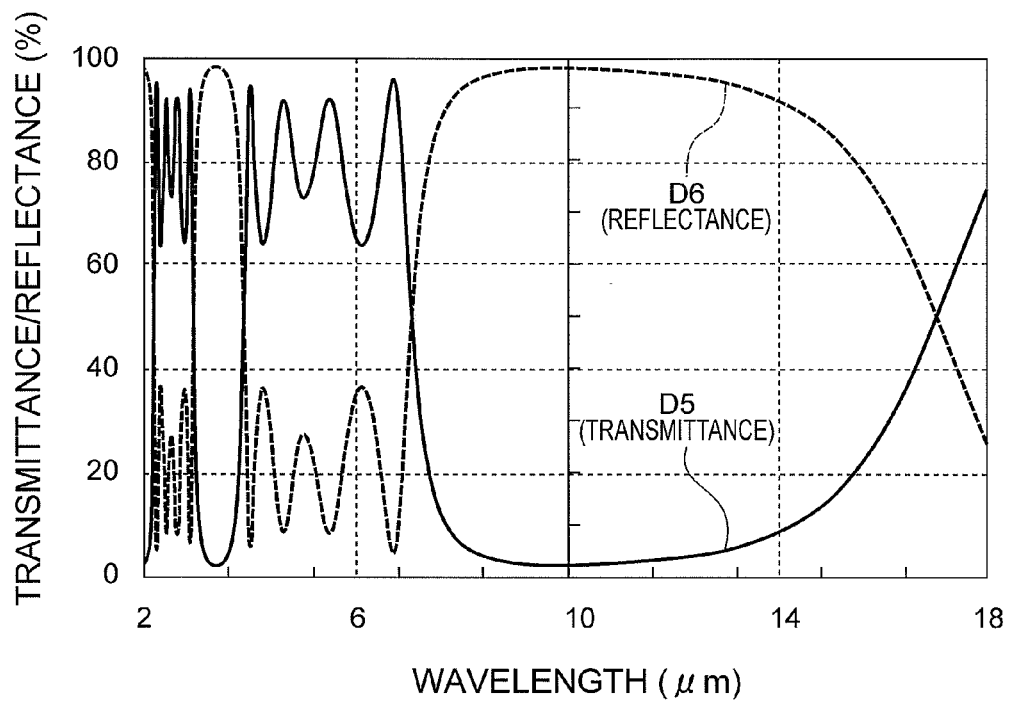
FIG. 14 is a graph showing the optical characteristics of the reflection control film shown in FIG. 13.

FIG. 14 is a graph showing the optical characteristics of the reflection control film 130 shown in FIG. 13. In the graph of FIG. 14, the graph D5 indicates the transmittance, and the graph D6 indicates the reflectance. In this configuration example of the multilayer film, a high reflectance R=97.746% is obtained for light with a wavelength of 10 μm.

Figure 15:
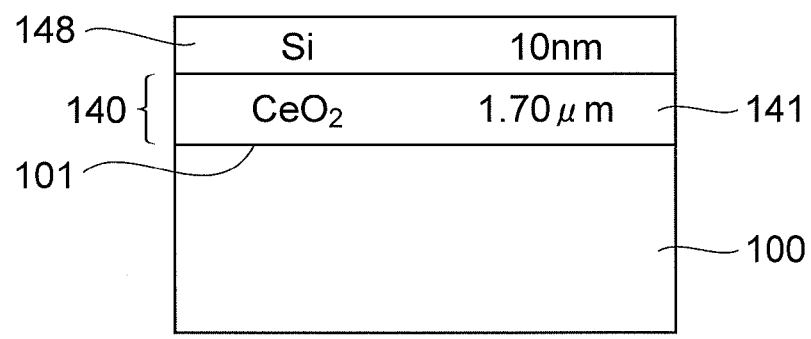
FIG. 15 is a side view showing a fourth configuration example of a reflection control film.

FIG. 15 is a side view showing a fourth configuration example of a reflection control film. A reflection control film 140 of the present configuration example is designed as an anti-reflection (AR) film for light with a wavelength λ=10 μm, and a $CeO_2$ film 141 with a thickness of 1.70 μm is formed on the end face 101 of the support 100, thereby composing the anti-reflection film 140 consisting of a single $CeO_2$ film. In addition, here, InP is assumed as the support 100. The refraction index of InP is n=3.2, and the refraction index of $CeO_2$ is n=1.47. Further, an Si film 148 shown in FIG. 15 is a protection film formed as the outermost layer with a film thickness which does not have an effect on the optical characteristics of the anti-reflection film 140.

Figure 16:
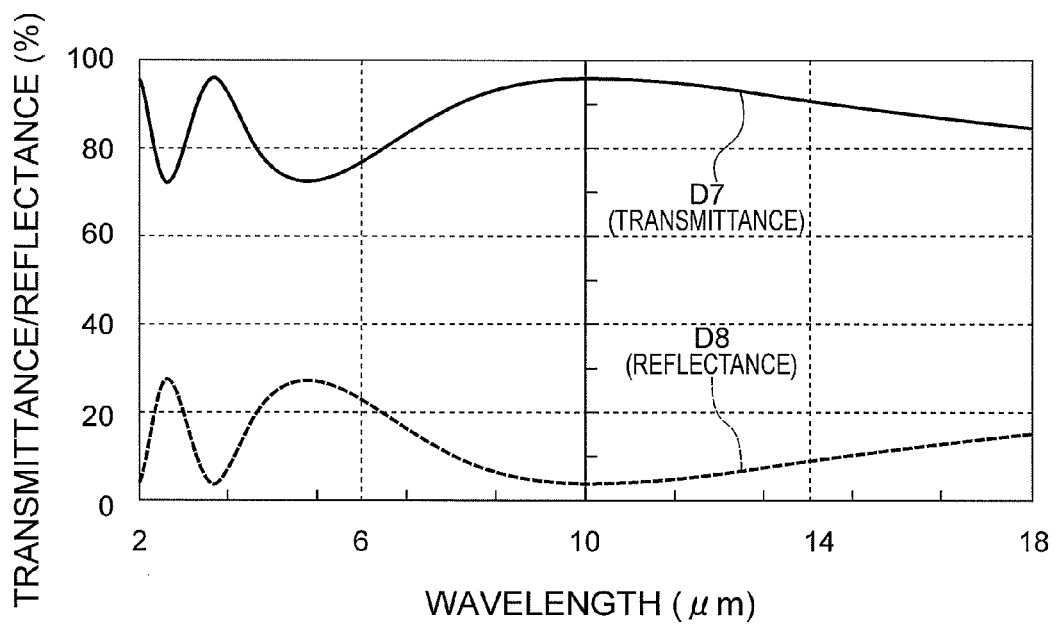
FIG. 16 is a graph showing the optical characteristics of the reflection control film shown in FIG. 15.

FIG. 16 is a graph showing the optical characteristics of the reflection control film 140 shown in FIG. 15. In the graph of FIG. 16, the graph D7 indicates the transmittance, and the graph D8 indicates the reflectance. In this configuration example of the single film, a high transmittance T=96.243% is obtained for light with a wavelength of 10 μm. In addition, the reflectance at this time is R=3.757%.

In the first to fourth configuration examples of the reflection control films shown in FIG. 9 to FIG. 16, any of these is shown as an example designed as an anti-reflection film or a high-reflection film for light with a wavelength λ=10 μm as an object of reflection control. However, generally, it is possible to design and apply such a reflection control film in the same way, not only for light with a wavelength of 10 μm, but also for light with an arbitrary wavelength.

Figure 17:
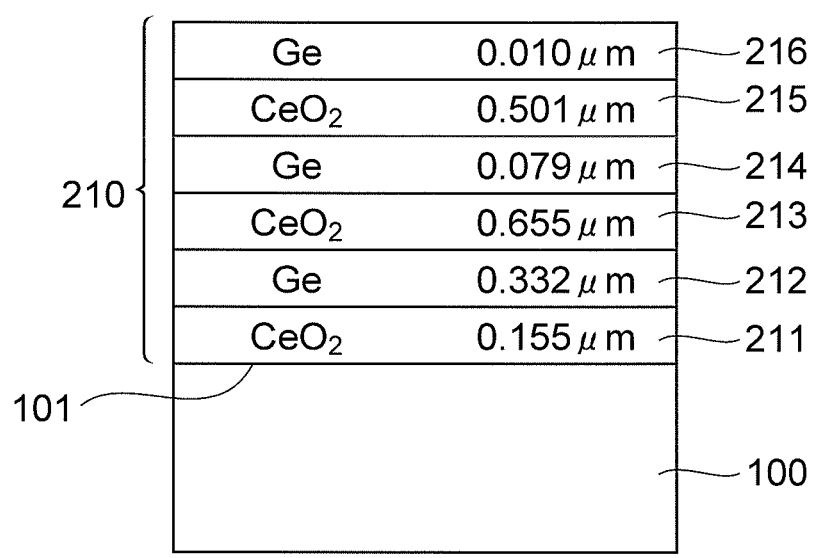
FIG. 17 is a side view showing a fifth configuration example of a reflection control film.

FIG. 17 is a side view showing a fifth configuration example of a reflection control film. A reflection control film 210 of the present configuration example is designed as an anti-reflection (AR) film for light with a wavelength λ=8 μm, and a $CeO_2$ film 211 with a thickness of 0.155 μm, a Ge film 212 with a thickness of 0.332 μm, a $CeO_2$ film 213 with a thickness of 0.655 μm, a Ge film 214 with a thickness of 0.079 μm, a $CeO_2$ film 215 with a thickness of 0.501 μm, and a Ge film 216 with a thickness of 0.010 μm are laminated on the end face 101 of the support 100, thereby composing the anti-reflection film 210 as a multilayer film.

Figure 18:
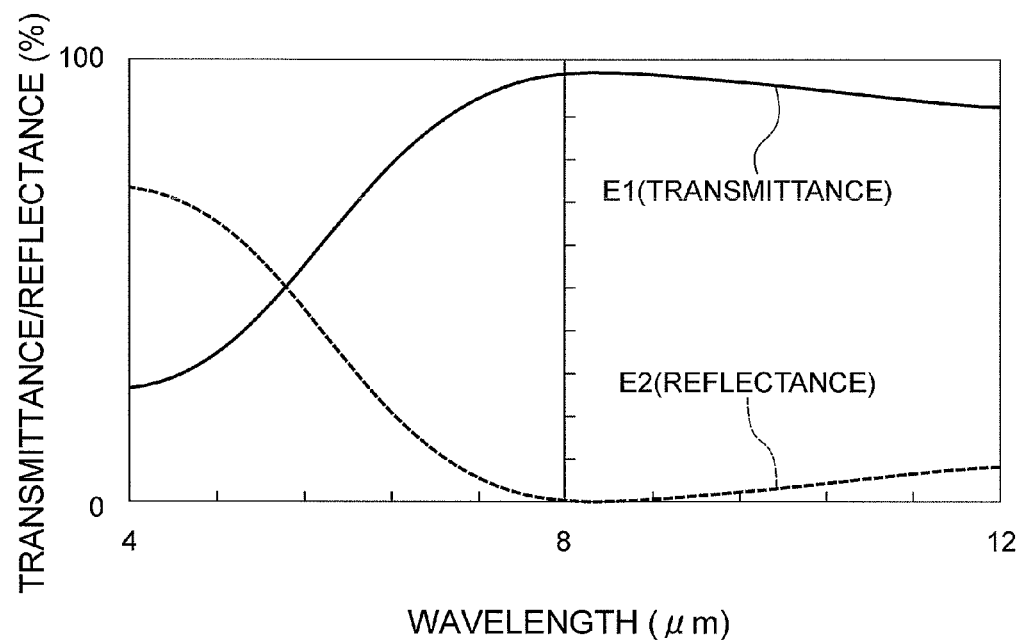
FIG. 18 is a graph showing the optical characteristics of the reflection control film shown in FIG. 17.

FIG. 18 is a graph showing the optical characteristics of the reflection control film 210 shown in FIG. 17. In the graph of FIG. 18, the graph E1 indicates the transmittance, and the graph E2 indicates the reflectance. In this configuration example of the multilayer film, a high transmittance T=99.644% is obtained for light with a wavelength of 8 μm.

Figure 19:
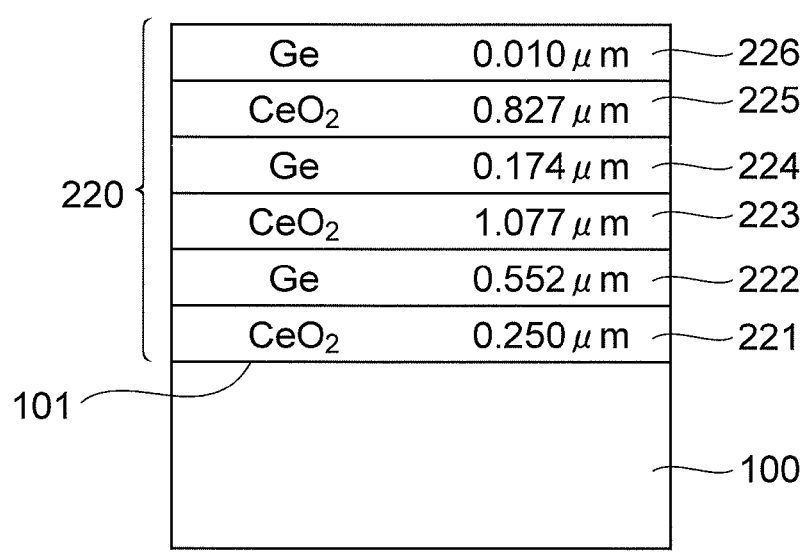
FIG. 19 is a side view showing a sixth configuration example of a reflection control film.

FIG. 19 is a side view showing a sixth configuration example of a reflection control film. A reflection control film 220 of the present configuration example is designed as an anti-reflection (AR) film for light with a wavelength λ=13 μm, and a $CeO_2$ film 221 with a thickness of 0.250 μm, a Ge film 222 with a thickness of 0.552 μm, a $CeO_2$ film 223 with a thickness of 1.077 μm, a Ge film 224 with a thickness of 0.174 μm, a $CeO_2$ film 225 with a thickness of 0.827 μm, and a Ge film 226 with a thickness of 0.010 μm are laminated on the end face 101 of the support 100, thereby composing the anti-reflection film 220 as a multilayer film.

Figure 20:
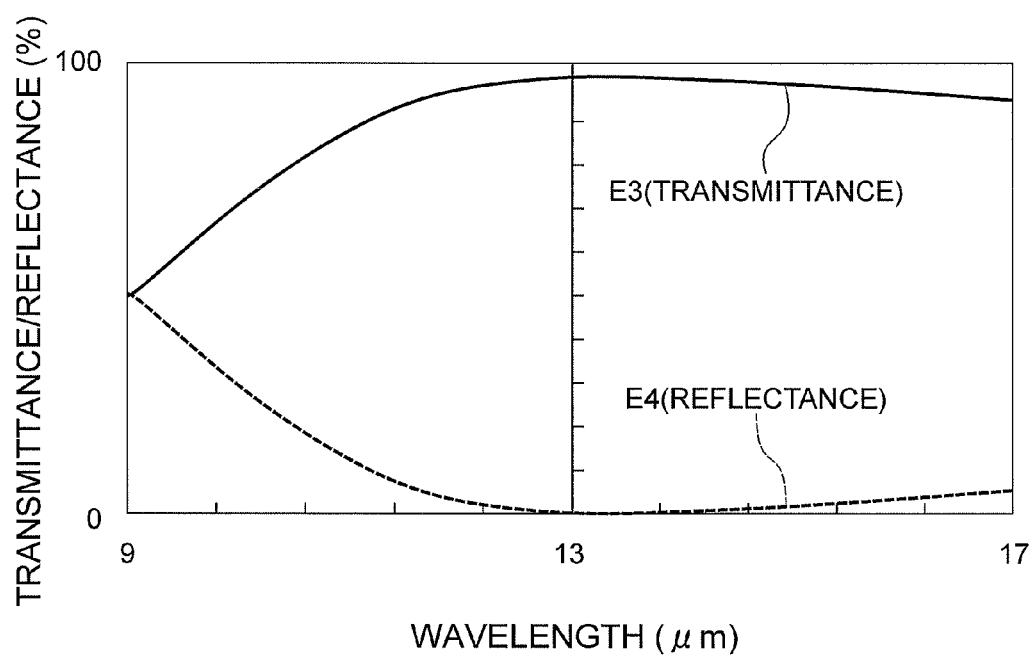
FIG. 20 is a graph showing the optical characteristics of the reflection control film shown in FIG. 19.

FIG. 20 is a graph showing the optical characteristics of the reflection control film 220 shown in FIG. 19. In the graph of FIG. 20, the graph E3 indicates the transmittance, and the graph E4 indicates the reflectance. In this configuration example of the multilayer film, a high transmittance T=99.869% is obtained for light with a wavelength of 13 μm.

In addition, with respect to the above-described reflection control film including the $CeO_2$ film, in the case where deliquescence of $CeO_2$ becomes a concern, for example, when the laser device on which a reflection control film is formed is used in an environment of being exposed to the atmosphere for a long period, a protection film for protecting the $CeO_2$ films included in the reflection control film is preferably provided as the outermost layer of the reflection control film. Further, as such a protection film, particularly, an Si film is preferably used.

Figure 24:
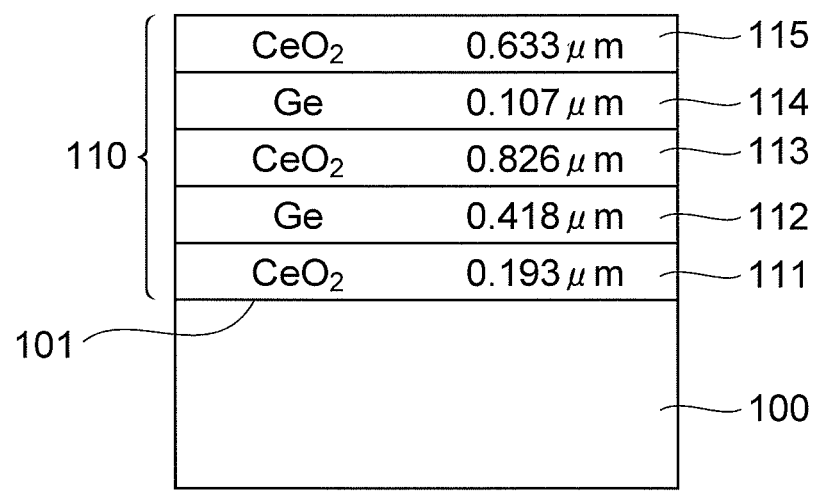
FIG. 24 is a side view showing a modified example of the reflection control film shown in FIG. 9.
Figure 25:
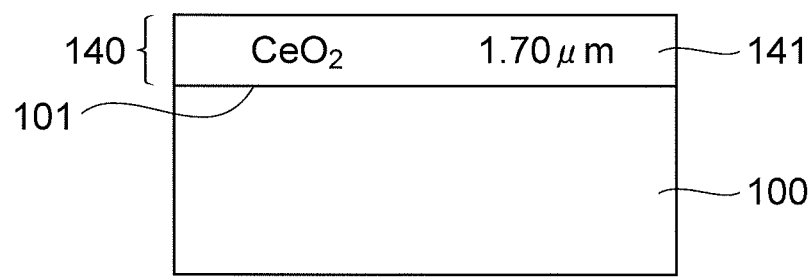
FIG. 25 is a side view showing a modified example of the reflection control film shown in FIG. 15.

For example, as shown in FIG. 9, in the case where the outermost layer of the reflection control film 110 is the $CeO_2$ film 115, the protection film 118 such as an Si film is formed on the outer side thereof. In this case, the Si protection film is preferably formed so as to have a thin film thickness (film thickness of, for example, about 10 nm) to the extent of having no effect on the optical characteristics of the reflection control film 110. Further, the Si protection film 148 in the configuration shown in FIG. 15 is the same. On the other hand, for example, as the reflection control film 120 shown in FIG. 11, in the case where the outermost layer of the reflection control film is a Ge film, this Ge film functions as a protection film for the $CeO_2$ film. In addition, as shown in FIG. 9 and FIG. 15, even in the case where the outermost layer of the reflection control film is a $CeO_2$ film, when deliquescence of $CeO_2$ does not become a concern according to conditions of use and the like for the laser device, as the modified examples of the reflection control films of FIG. 9 and FIG. 15, which are shown in FIG. 24 and FIG. 25, the laser device may be configured not providing the outermost protection film such as an Si protection film.

A method for designing a reflection control film composed of a single $CeO_2$ film or a multilayer film including $CeO_2$ films will be briefly described. First, the most basic case of the single film will be considered. Given that refractive indices of a light-incident side medium, a reflection thin film, and a support medium are respectively $n_0$, n, and $n_m$, and in the case where light with a wavelength λ is vertically made incident to the thin film with a film thickness d, the conditions under which a reflectance R becomes 0 on the anti-reflection (non-reflective) coating are as follows.

$$nd = q\lambda/4 \ (q=1,3,5,\ldots)$$

$$n = (n_0 n_m)^{1/2}$$

These two equations indicate the relationship between the wavelength and the film thickness, and relationship between the refraction indices, respectively.

In order to apply coating of a reflection control film onto various supports in combination of film thicknesses of λ/4, λ/2, and the like, it is necessary to prepare a thin film with an arbitrary refraction index determined by the above-described equations in an intended wavelength region. As one of the methods for solving this problem, there is an idea of an equivalent film. That is, the idea is to equivalently constitute a thin film with a refraction index n and a film thickness λ/4 with a periodic multilayer structure consisting of thin films of material of a low refraction index $n_1$ and thin films of material of a high refraction index $n_2$. In this case, theoretically, it is infinitely possible to combine refraction indices, film thicknesses of the respective layers, and the number of layers, however, a practical solution is to be adopted from among those, to design a reflection control film.

For example, a combination of refraction indices $n_1$ and $n_2$ of two layers of λ/4, that makes reflectance R=0 (here, $n_1 < n_m < n_2$) is calculated. Then, each of those is replaced with a periodic structure of actual substance (for example, $CeO_2$ and Ge) so as to make the $n_1$ and $n_2$ and the refraction index equivalent. In addition, the anti-reflection film of R=0 has been described in the above description, however, it is possible to design a reflection film such as a high-reflection film of, for example, R=1 with the same idea. Further, an actual calculation in the design of a reflection control film may be executed, for example, by a commercially available design software, a general-purpose calculation program or the like.

An example of a method for manufacturing a reflection control film with the above-described configuration will be briefly described. First, in the same way as the manufacturing process of a normal quantum cascade laser, crystal growth of a laser structure is performed by an MOCVD method or the like on a substrate of a predetermined material such as an InP substrate. Then, a stripe structure is formed by use of photolithography and etching techniques, and the device end faces in the laser cavity structure are formed by cleavage, to form a laser bar state.

Next, the laser bar is fixed such that only the device end faces are exposed by use of a single-purpose jig in a vacuum evaporation apparatus, for example, an electron beam (EB) evaporation apparatus, to form a thin film of a desired material so as to have a necessary film thickness on the end faces. For example, in the case where the reflection control film is a multilayer film of $CeO_2$/Ge, vapor deposition is performed from multiple sources with vapor deposition sources of $CeO_2$ and Ge, to form a reflection control multilayer film in which $CeO_2$ films and Ge films are alternately laminated. Further, in the case where an Si protection film is formed on the outer side of the reflection control film, vapor deposition may be performed from multiple sources with vapor deposition sources of Si in addition to $CeO_2$ and Ge. Here, deposition is possible for all of $CeO_2$, Ge, and Si by electron beam evaporation, and it is possible to form a multilayer film and a protection film without breaking a vacuum by the evaporation apparatus having multiple sources.

Further, as described above with regard to the graph of FIG. 6, for example, by carrying out substrate heating at 250° C. in the process of forming the reflection control film, the effects of prevention of mixing with moisture and an improvement in film quality are obtained. After the reflection control film is formed on the device end faces of the quantum cascade laser, the state of the laser bar is cut out into one chip, and the assembly process and the packaging process are carried out, that completes the laser device. In addition, for formation of a reflection control film, generally, the above-described electron beam evaporation is used, however, deposition is possible in the same way by use of another method such as resistance heating evaporation or sputtering.

The quantum cascade laser including the reflection control film with the above-described configuration will be further described along with a specific configuration example of the cavity structure thereof. Here, in recent years, with respect to the application of a quantum cascade laser, a laser device which maintains single-mode oscillation whose spectral purity is high has been demanded in many application fields of laser absorption spectroscopy, environmental gas measurement, and the like. However, by a Fabry-Perot (FP) type laser device which performs multimode oscillation due to an axial mode of a cavity length, it is difficult to satisfy such a demand for single-mode oscillation.

Then, with respect to quantum cascade lasers as well, various dynamic single-mode lasers have been developed in the same way as a semiconductor laser of a communication wavelength band. In order to realize a dynamic single-mode, pronounced mode dependence to oscillation threshold gain is provided to block oscillations other than the basic mode oscillation. As such a laser device, there are, for example, an external cavity (EC) type quantum cascade laser, a distributed feedback (DFB) type quantum cascade laser, and the like. The reflection control film including the $CeO_2$ film described above may be preferably applied to these quantum cascade lasers.

With respect to the configuration of the reflection control film on the device end face of the quantum cascade laser, and the laser cavity structure, specifically, for example, the laser cavity structure may be configured to be an external cavity (EC) type in which an anti-reflection film is formed as a first reflection control film on the first end face, and a reflection film is formed as a second reflection control film on the second end face. Alternatively, the laser cavity structure may be configured to be a distributed feedback (DFB) type in which an anti-reflection film is formed as a first reflection control film on the first end face, and an anti-reflection film is formed as a second reflection control film on the second end face.

In accordance with the configuration in which the reflection control film including the $CeO_2$ film described above is applied, by forming reflection control films having appropriate characteristics respectively on the first and second end faces, it is possible to preferably realize an EC type, a DFB type, or another type laser cavity structure in the quantum cascade laser, respectively. Hereinafter, a specific example of a configuration of the quantum cascade laser will be described with reference to FIG. 21 to FIG. 23.

Figure 21:
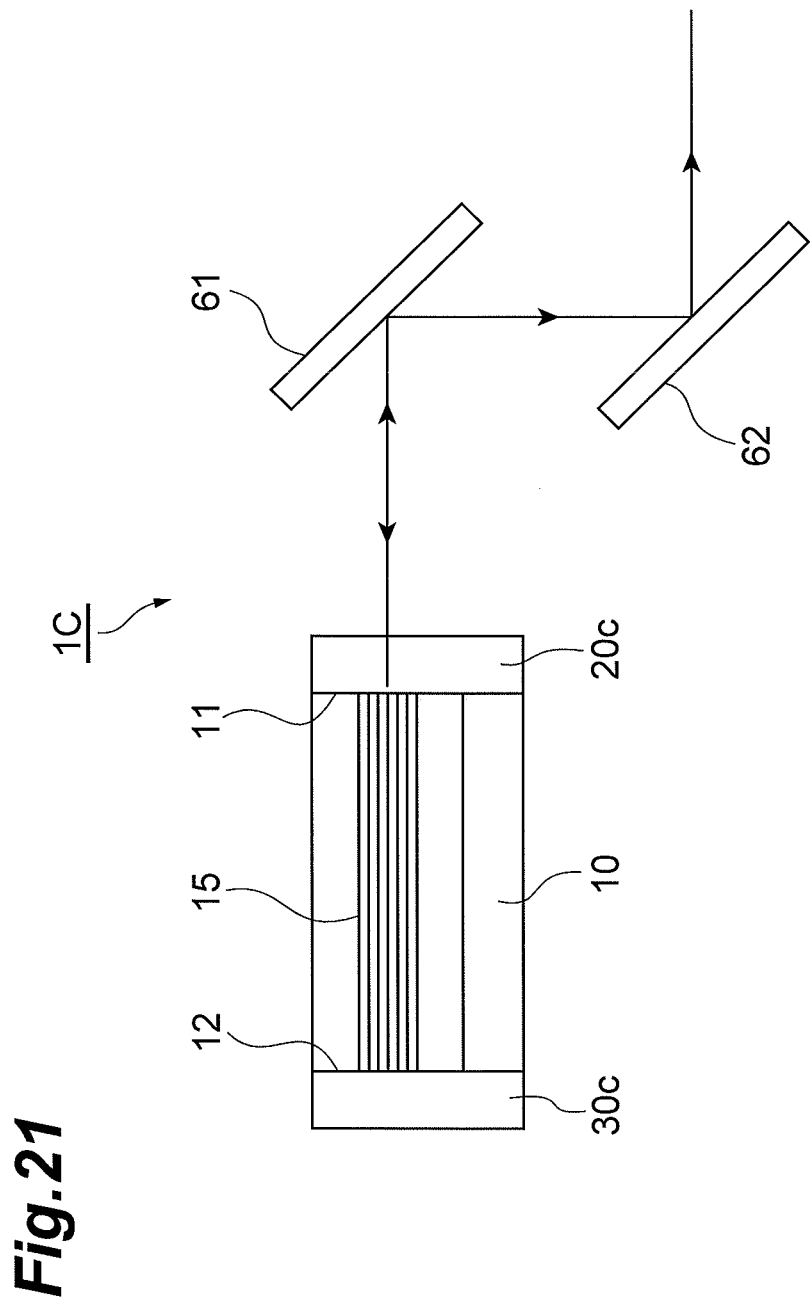
FIG. 21 is a diagram showing a first configuration example of a cavity structure in the quantum cascade laser.

FIG. 21 is a diagram showing a first configuration example of a laser cavity structure in a quantum cascade laser. In a quantum cascade laser 1C according to the present configuration example, with respect to a laser device main body including the substrate 10 and the active layer 15 by multistage-laminating unit laminate structures, an anti-reflection (AR) film 20c is formed as a first reflection control film on the first end face 11, and a high-reflection (HR) film 30c is formed as a second reflection control film on the second end face 12. In such a configuration, the first end face 11 serves as an output end face of a laser beam from the device main body to the outside.

Further, in this configuration example, a diffraction grating mirror 61 which feed-backs only light within a narrow wavelength range in the light from the device main body in the resonating direction is disposed as reflection means at an external predetermined position facing the first end face 11 and the anti-reflection film 20c of the laser device main body. Thereby, the EC type laser resonator consists of the high-reflection film 30c on the second end face 12 and the external diffraction grating mirror 61.

In such a configuration, the FP mode intrinsic to the device is inhibited by the anti-reflection film 20c on the first end face 11, and only the mode most strongly fed-back by the diffraction grating mirror 61 in the longitudinal modes oscillates in the laser cavity structure. Further, light reflected in a direction different from the resonating direction by the diffraction grating mirror 61 is output to the outside as a laser beam via a reflection mirror 62. Further, by changing an angle of installation of the diffraction grating mirror 61 to the device main body, it is possible to make the wavelength of the output laser beam continuously variable within the range of gain spectrum.

Figure 22:
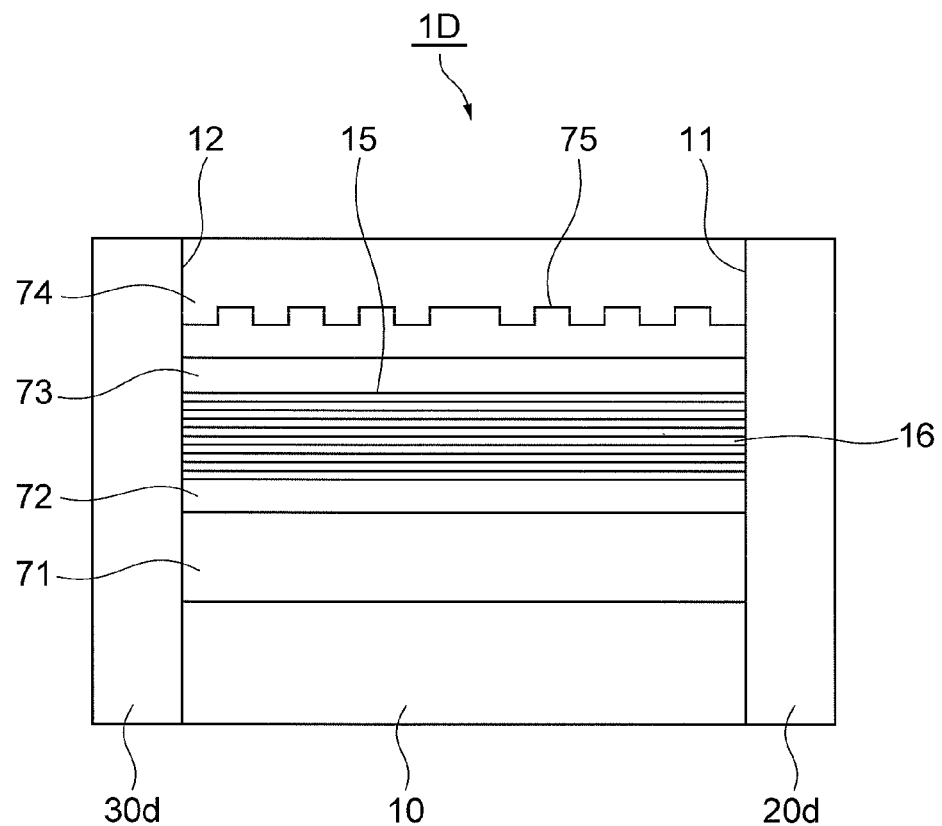
FIG. 22 is a diagram showing a second configuration example of a cavity structure in the quantum cascade laser.

FIG. 22 is a diagram showing a second configuration example of a laser cavity structure in a quantum cascade laser. In a quantum cascade laser 1D according to the present configuration example, a lower cladding layer 71, a lower guide layer 72, the active layer 15 by multistage-laminating the unit laminate structures 16, an upper guide layer 73, and an upper cladding layer 74 are laminated on the substrate 10, thereby composing a laser device main body. Moreover, a diffraction grating structure 75 is formed in the upper cladding layer 74, thereby composing a DFB type laser resonator.

Further, with respect to the DFB type laser device main body including the substrate 10, the active layer 15 by multistage-laminating the unit laminate structures 16, and the diffraction grating structure 75, an anti-reflection (AR) film 20d is formed as a first reflection control film on the first end face 11, and in the same way, an anti-reflection (AR) film 30d is formed as a second reflection control film on the second end face 12.

Here, with respect to the diffraction grating structure 75 provided in the waveguide of the device main body, there are generally two modes with minimum oscillation threshold gain in a uniform diffraction grating whose grating pitches are even, and bi-mode oscillation easily occurs according thereto. Meanwhile, in the configuration example of FIG. 22, a phase shift diffraction grating whose phase is inverted along the way is used in the diffraction grating structure 75. In such a configuration, because there is one mode with minimum oscillation threshold gain in principle, single-mode oscillation can be obtained.

However, in the DFB type laser 1D using the phase shift diffraction grating structure 75 as well, in the case where light reflection is produced on the both end faces 11 and 12 of the device main body, for example, as the cleavage plane whose reflectance of approximately 30%, because the oscillation mode produces complex behavior depending on a phase of the diffraction grating on the end face, it is difficult to obtain a stable single-mode operation. Meanwhile, in accordance with the configuration in which the anti-reflection films 20d and 30d are provided on the end faces 11 and 12 of the device main body as described above, it is possible to realize a stable single-mode operation. In addition, such a configuration using the anti-reflection films can be, in the same way, applied to the laser device having a normal diffraction grating structure.

Figure 23:
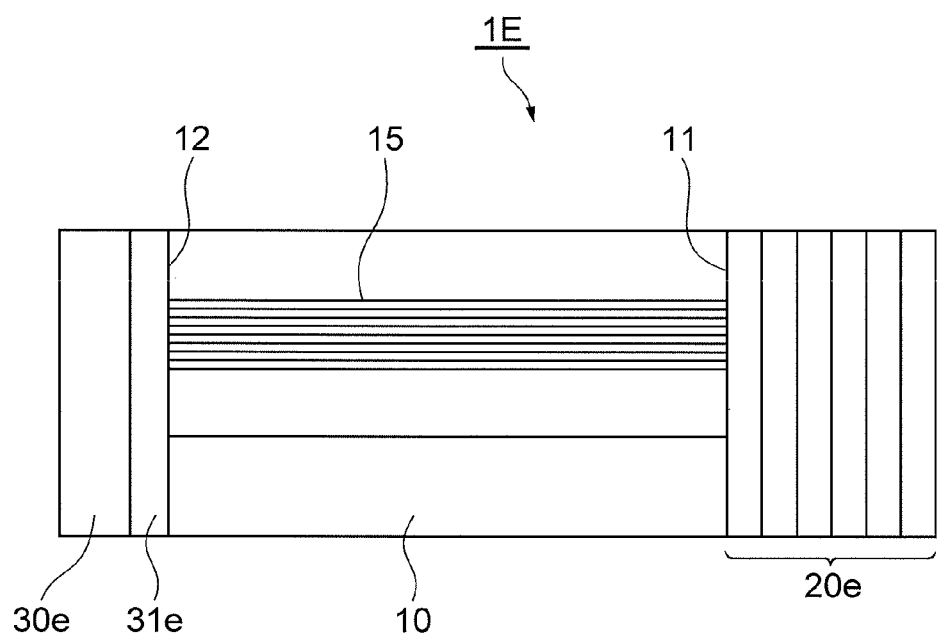
FIG. 23 is a diagram showing a third configuration example of a cavity structure in the quantum cascade laser.

FIG. 23 is a diagram showing a third configuration example of a laser cavity structure in a quantum cascade laser. In a quantum cascade laser 1E according to the present configuration example, with respect to a laser device main body including the substrate 10 and the active layer 15 by multistage-laminating unit laminate structures, an anti-reflection (AR) film 20e is formed as a first reflection control film on the first end face 11, and a high-reflection (HR) film 30e is formed as a second reflection control film via a $CeO_2$ insulating film 31e on the second end face 12.

In such a configuration, the anti-reflection film 20e on the first end face 11 of the device main body can be composed of, for example, a multilayer film in which $CeO_2$ films and Ge films are alternately laminated. Further, the high-reflection film 30e on the $CeO_2$ insulating film 31e on the second end face 12 can be composed of, for example, a reflection control film including $CeO_2$ films.

Alternatively, the high-reflection film 30e may be composed of, for example, a metal film such as an Au film. In this case, the high-reflection film 30e is formed by evaporating metal such as Au via the $CeO_2$ transparent insulating film 31e. As a specific configuration example, a configuration in which a Ti film with a thickness of 5 nm for improving the adhesiveness with $CeO_2$ is formed on the $CeO_2$ insulating film 31e, and further, an Au film with a thickness of 200 nm is formed on the Ti film can be used.

The quantum cascade laser according to the present invention is not limited to the above-described embodiments and configuration examples, and various modifications thereof are possible. For example, in the configuration examples described above, the example has been shown that the InP substrate is used as the semiconductor substrate, and the active layer is made of InGaAs/InAlAs, however, specifically, various configurations may be used as long as emission transition due to intersubband transition in the quantum well structure is possible.

As the semiconductor material system, in addition to InGaAs/InAlAs described above, various material systems such as AlGaAs/GaAs, InAs/AlGaSb, AlGaN/InGaN, and Si/SiGe, etc., may be used. Also, various methods can be used as a semiconductor crystal growth method. Further, as the lamination structure in the active layer of the quantum cascade laser and the semiconductor lamination structure as a whole of the laser device, various structures other than the above-described structures may be used.

Further, as the reflection control film, in the above-described embodiment, the configuration in which the reflection control films are formed on both the first and second end faces in the laser cavity structure with respect to the laser device main body including the semiconductor substrate and the active layer has been shown, however, the invention is not limited to such a configuration. Generally, it suffices as long as the quantum cascade laser is configured such that a reflection control film including at least one layer of $CeO_2$ film is formed on at least one of the first end face and the second end face facing each other in the laser cavity structure for light with a predetermined wavelength to be generated in the active layer. Further, as the cavity structure of the quantum cascade laser, the EC type and the DFB type are exemplified in the respective configuration examples described above, however, a laser cavity structure other than those may be used. Further, in the above-described embodiment, the first layer of the reflection control film is a $CeO_2$ film functioning as an insulating film, however, another configuration may be adopted.

The quantum cascade laser according to the embodiment described above includes (1) a semiconductor substrate, and (2) an active layer that is provided on the semiconductor substrate, and has a cascade structure in which quantum well emission layers and injection layers are alternately laminated by multistage-laminating unit laminate structures each consisting of the quantum well emission layer and the injection layer, the active layer generates light by intersubband transition in a quantum well structure, and (3) in a laser cavity structure for light with a predetermined wavelength to be generated in the active layer, a reflection control film including at least one layer of $CeO_2$ film is formed on at least one of a first end face and a second end face facing each other.

Here, as the reflection control film, specifically, a configuration of a multilayer film in which the above-described $CeO_2$ film serving as a low refraction index film and a high refraction index film are laminated can be used. According to such a reflection control multilayer film, it is possible to preferably control a reflectance for light with a predetermined wavelength on the device end faces by the specific design of the multilayer structure using the low refraction index films and the high refraction index films.

Further, in the case where the reflection control film is configured as a multilayer film in this way, the high refraction index film in the multilayer film is preferably a Ge film in contrast to the $CeO_2$ film functioning as the low refraction index film. Thus, according to the structure in which the $CeO_2$ films and the Ge films are alternately laminated, it is possible to preferably constitute a reflection control film having the multilayer structure.

Alternatively, this reflection control film may be composed of, not a multilayer film including $CeO_2$ films, but a single $CeO_2$ film. According to such a configuration as well, it is possible to preferably control a reflectance for light with a predetermined wavelength on the device end face.

Further, in the quantum cascade laser having the above-described configuration, the reflection control film formed on the laser device end face is preferably an anti-reflection film for light with a predetermined wavelength, or a reflection film that reflects light with a predetermined wavelength at a predetermined reflectance. By using such an anti-reflection (AR) film or a reflection film (for example, a high-reflection (HR) film) including a $CeO_2$ film, it is possible to preferably constitute a quantum cascade laser according to the specific cavity structure thereof.

With respect to the configuration of the reflection control film on the device end face of the quantum cascade laser, and the laser cavity structure, specifically, for example, the laser cavity structure may be configured to be an external cavity type in which the anti-reflection film is formed as a first reflection control film on the first end face, and the reflection film is formed as a second reflection control film on the second end face. Alternatively, the laser cavity structure may be configured to be a distributed feedback type in which the anti-reflection film is formed as a first reflection control film on the first end face, and the anti-reflection film is formed as a second reflection control film on the second end face.

In accordance with the configuration in which the reflection control film including the $CeO_2$ film described above is applied, by forming appropriate reflection control films respectively on the first and second end faces, it is possible to preferably realize the laser cavity structure in the quantum cascade laser.

The present invention is applicable as a quantum cascade laser which is capable of preferably realizing reflectance control with light in a mid-infrared region on a laser device end face.

From the invention thus described, it will be obvious that the invention may be varied in many ways. Such variations are not to be regarded as a departure from the spirit of and scope of the invention, and all such modifications as would be obvious to one skilled in the art are intended for inclusion within the scope of the following claims.

What is claimed is:

1. A quantum cascade laser comprising:
   a semiconductor substrate; and
   an active layer that is provided on the semiconductor substrate, and has a cascade structure in which quantum well emission layers and injection layers are alternately laminated by multistage-laminating unit laminate structures each consisting of the quantum well emission layer and the injection layer, the active layer generates light by intersubband transition in a quantum well structure, wherein
   in a laser cavity structure in a device main body including the semiconductor substrate and the active layer, for light with a predetermined wavelength within a wavelength region of 7 to 15 μm to be generated in the active layer, a reflection control film including at least one layer of $CeO_2$ film is formed on at least one device end face of a first end face and a second end face of the device main body facing each other,
   the reflection control film is a multilayer film in which the $CeO_2$ film serving as a low refraction index film and a high refraction index film are laminated, and the $CeO_2$ film is formed directly on the device end face of the device main body as the first layer in the reflection control film, and
   the high refraction index film in the multilayer film is a Ge film.

2. The quantum cascade laser according to claim 1, wherein the reflection control film is an anti-reflection film for light with the predetermined wavelength, or a reflection film that reflects light with the predetermined wavelength at a predetermined reflectance.

3. The quantum cascade laser according to claim 1, wherein the laser cavity structure is configured to be an external cavity type in which the anti-reflection film is formed as a first reflection control film on the first end face, and the reflection film is formed as a second reflection control film on the second end face.

4. The quantum cascade laser according to claim 2, wherein the laser cavity structure is configured to be a distributed feedback type in which the anti-reflection film is formed as a first reflection control film on the first end face, and the anti-reflection film is formed as a second reflection control film on the second end face.

* * * * *